(12) United States Patent
Karnezos

(10) Patent No.: US 7,582,960 B2
(45) Date of Patent: *Sep. 1, 2009

(54) MULTIPLE CHIP PACKAGE MODULE INCLUDING DIE STACKED OVER ENCAPSULATED PACKAGE

(75) Inventor: Marcos Karnezos, Palo Alto, CA (US)

(73) Assignee: STATS ChipPAC Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 11/381,901

(22) Filed: May 5, 2006

(65) Prior Publication Data

US 2006/0249851 A1 Nov. 9, 2006

Related U.S. Application Data

(60) Provisional application No. 60/678,152, filed on May 5, 2005.

(51) Int. Cl.
*H01L 23/02* (2006.01)
(52) U.S. Cl. .............. 257/686; 257/790; 257/E25.022; 257/E25.013
(58) Field of Classification Search .............. 257/790, 257/686, 777, 778, 784
See application file for complete search history.

(56) References Cited

U.S. PATENT DOCUMENTS

| 5,222,014 A | 6/1993 | Lin |
| 5,229,960 A | 7/1993 | De Givry |
| 5,323,060 A * | 6/1994 | Fogal et al. .................. 257/777 |
| 5,340,771 A | 8/1994 | Rostoker |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,652,185 A | 7/1997 | Lee |
| 5,744,863 A | 4/1998 | Culnane et al. |
| 5,898,219 A | 4/1999 | Barrow |
| 5,899,705 A | 5/1999 | Akram |
| 5,903,049 A | 5/1999 | Mori |
| 5,977,640 A | 11/1999 | Bertin et al. |
| 5,982,633 A | 11/1999 | Jeansonne |
| 5,994,166 A * | 11/1999 | Akram et al. ............... 438/108 |
| 6,025,648 A | 2/2000 | Takahashi et al. |
| 6,034,875 A | 3/2000 | Heim et al. |
| 6,075,289 A | 6/2000 | Distefano |
| 6,118,176 A | 9/2000 | Tao et al. |
| 6,133,626 A | 10/2000 | Hawke et al. |

(Continued)

FOREIGN PATENT DOCUMENTS

JP 05152505 A 6/1993

(Continued)

OTHER PUBLICATIONS

Rao R. Tummala, Microelectronics Packaging Handbook Semiconductor Packaging, Part II, 1997, Second Edition, Kluwer Academic Publishers, p. II-168.*

*Primary Examiner*—David A Zarneke

(57) ABSTRACT

A module having multiple die includes a first package (such as a land grid array package) inverted and mounted upon a lower substrate, and one or more die mounted or stacked over the upward-facing side of the inverted package.

14 Claims, 3 Drawing Sheets

U.S. PATENT DOCUMENTS

| | | | |
|---|---|---|---|
| 6,157,080 A | 12/2000 | Tamaki et al. | |
| 6,201,266 B1 | 3/2001 | Ohuchi et al. | |
| 6,201,302 B1 | 3/2001 | Tzu | |
| 6,238,949 B1 | 5/2001 | Nguyen et al. | |
| 6,265,766 B1 | 7/2001 | Moden | |
| 6,274,930 B1 | 8/2001 | Vaiyapuri et al. | |
| 6,316,838 B1 | 11/2001 | Ozawa et al. | |
| 6,333,552 B1 | 12/2001 | Kakimoto et al. | |
| 6,340,846 B1 | 1/2002 | LoBianco et al. | |
| 6,376,904 B1 | 4/2002 | Haba et al. | |
| 6,388,313 B1 | 5/2002 | Lee et al. | |
| 6,400,007 B1 | 6/2002 | Wu et al. | |
| 6,407,456 B1 | 6/2002 | Ball | |
| 6,413,798 B2 | 7/2002 | Asada | |
| 6,414,381 B1 | 7/2002 | Takeda | |
| 6,424,050 B1 | 7/2002 | Komiyama | |
| 6,441,496 B1 | 8/2002 | Chen | |
| 6,445,064 B1 | 9/2002 | Ishii et al. | |
| 6,462,421 B1 | 10/2002 | Hsu et al. | |
| 6,472,732 B1 | 10/2002 | Terui | |
| 6,472,741 B1 | 10/2002 | Chen et al. | |
| 6,489,676 B2 | 12/2002 | Taniguchi et al. | |
| 6,492,726 B1 | 12/2002 | Quek et al. | |
| 6,501,165 B1 | 12/2002 | Farnworth et al. | |
| 6,512,303 B2 | 1/2003 | Moden | |
| 6,538,319 B2 | 3/2003 | Terui | |
| 6,545,365 B2 | 4/2003 | Kondo et al. | |
| 6,545,366 B2 | 4/2003 | Michii et al. | |
| 6,552,423 B2 | 4/2003 | Song et al. | |
| 6,555,902 B2 | 4/2003 | Lo et al. | |
| 6,570,249 B1 | 5/2003 | Liao et al. | |
| 6,583,503 B2 | 6/2003 | Akram et al. | |
| 6,590,281 B2 | 7/2003 | Wu et al. | |
| 6,593,647 B2 | 7/2003 | Ichikawa | |
| 6,593,648 B2 | 7/2003 | Emoto | |
| 6,593,662 B1 | 7/2003 | Pu et al. | |
| 6,599,779 B2 | 7/2003 | Shim et al. | |
| 6,607,937 B1 | 8/2003 | Corisis | |
| 6,611,063 B1 | 8/2003 | Ichinose et al. | |
| 6,621,169 B2 | 9/2003 | Kikuma et al. | |
| 6,621,172 B2 | 9/2003 | Nakayama et al. | |
| 6,649,448 B2 | 11/2003 | Tomihara | |
| 6,650,019 B2 | 11/2003 | Glenn et al. | |
| 6,657,290 B2 | 12/2003 | Fukui et al. | |
| 6,667,556 B2 | 12/2003 | Moden | |
| 6,690,089 B2 | 2/2004 | Uchida | |
| 6,700,178 B2 | 3/2004 | Chen et al. | |
| 6,706,557 B2 | 3/2004 | Koopmans | |
| 6,716,676 B2 | 4/2004 | Chen et al. | |
| 6,734,539 B2 | 5/2004 | Degani et al. | |
| 6,734,552 B2 | 5/2004 | Combs et al. | |
| 6,737,750 B1 | 5/2004 | Hoffman et al. | |
| 6,746,894 B2 | 6/2004 | Fee et al. | |
| 6,747,361 B2 | 6/2004 | Ichinose | |
| 6,762,488 B2 | 7/2004 | Maeda et al. | |
| 6,777,799 B2 | 8/2004 | Kikuma et al. | |
| 6,777,819 B2 | 8/2004 | Huang | |
| 6,787,915 B2 | 9/2004 | Uchida et al. | |
| 6,787,916 B2 | 9/2004 | Halahan | |
| 6,794,749 B2 | 9/2004 | Akram | |
| 6,818,980 B1 | 11/2004 | Pedron, Jr. | |
| 6,828,665 B2 | 12/2004 | Pu et al. | |
| 6,835,598 B2 | 12/2004 | Baek et al. | |
| 6,838,761 B2 | 1/2005 | Karnezos | |
| 6,847,105 B2 | 1/2005 | Koopmans | |
| 6,864,566 B2 | 3/2005 | Choi, III | |
| 6,882,057 B2 | 4/2005 | Hsu | |
| 6,890,798 B2 | 5/2005 | McMahon | |
| 6,900,528 B2 | 5/2005 | Mess et al. | |
| 6,906,415 B2 | 6/2005 | Jiang et al. | |
| 6,906,416 B2 | 6/2005 | Karnezos | |
| 6,930,378 B1 | 8/2005 | St. Amand et al. | |
| 6,930,396 B2 | 8/2005 | Kurita et al. | |
| 6,933,598 B2 | 8/2005 | Karnezos | |
| 6,951,982 B2 | 10/2005 | Chye et al. | |
| 6,972,481 B2 | 12/2005 | Karnezos | |
| 7,034,387 B2 | 4/2006 | Karnezos | |
| 7,034,388 B2 | 4/2006 | Yang et al. | |
| 7,045,887 B2 | 5/2006 | Karnezos | |
| 7,049,691 B2 | 5/2006 | Karnezos | |
| 7,053,476 B2 | 5/2006 | Karnezos | |
| 7,053,477 B2 | 5/2006 | Karnezos | |
| 7,057,269 B2 * | 6/2006 | Karnezos | 257/686 |
| 7,061,088 B2 * | 6/2006 | Karnezos | 257/686 |
| 7,064,426 B2 | 6/2006 | Karnezos | |
| 7,071,568 B1 | 7/2006 | St. Amand et al. | |
| 7,081,678 B2 | 7/2006 | Liu | |
| 7,101,731 B2 | 9/2006 | Karnezos | |
| 7,132,311 B2 | 11/2006 | Akiba et al. | |
| 7,372,141 B2 * | 5/2008 | Karnezos et al. | 257/686 |
| 2002/0130404 A1 | 9/2002 | Ushijima et al. | |
| 2003/0113952 A1 | 6/2003 | Sambasivam et al. | |
| 2003/0153134 A1 | 8/2003 | Kawata et al. | |
| 2003/0178716 A1 * | 9/2003 | Maeda et al. | 257/686 |
| 2004/0061213 A1 | 4/2004 | Karnezos | |
| 2004/0113253 A1 * | 6/2004 | Karnezos | 257/686 |
| 2004/0212096 A1 | 10/2004 | Wang | |
| 2005/0104182 A1 * | 5/2005 | Kim | 257/686 |
| 2006/0043556 A1 | 3/2006 | Su | |
| 2006/0138631 A1 | 6/2006 | Tao et al. | |
| 2006/0189033 A1 | 8/2006 | Kim | |
| 2006/0197209 A1 | 9/2006 | Choi | |

FOREIGN PATENT DOCUMENTS

| | | |
|---|---|---|
| JP | 2001223326 A | 8/2001 |
| KR | 20010688614 A | 7/2001 |
| KR | 2004085348 A | 10/2004 |

* cited by examiner

MULTIPLE CHIP PACKAGE MODULE INCLUDING DIE STACKED OVER ENCAPSULATED PACKAGE

CROSS-REFERENCE TO RELATED APPLICATION

This application claims priority from U.S. Provisional Application No. 60/678,152, titled "Multipackage module including die stacked over encapsulated package", filed May 5, 2005, which is hereby incorporated herein by reference.

BACKGROUND

This invention relates to semiconductor chip packaging

Portable electronic products such as mobile telephones, mobile computers, and various consumer products require higher semiconductor functionality and performance in a limited footprint and minimal thickness and weight at the lowest cost. This has driven the industry to increase integration on the individual semiconductor chips.

More recently the industry has begun implementing integration on the "z-axis," that is, by stacking chips, and stacks of up to five or more chips in one package have been used. This provides a dense chip structure having the footprint of a one-chip package, in the range of 5×5 mm to 40×40 mm, and obtaining thicknesses that have been continuously decreasing, as the technology develops, from 2.3 mm to 0.5 mm. The packaging cost for a stacked die package is only incrementally higher than the packaging cost for a single chip package, and assembly yields have been high enough to assure a competitive final cost compared to packaging the chips in individual packages.

A primary practical limitation to the number of chips that can be stacked in a stacked die package is the low final test yield of the stacked-die package. Inevitably one or more of the chips in some packages will be defective. Therefore, the final package test yield, which is the product of the individual die test yields, always will be significantly less than 100%. Where one die in a package has low yield because of design complexity or technology, final package yields can be unacceptably low even if only two die are stacked in each package.

The dimensions of the various die that may be supplied for use in a particular device can vary significantly, and this presents challenges in construction of stacked die packages. For example, in a conventional stacked die package the upper die may be a memory die and the lower die may be a digital signal processor (DSP). The assembler's favored memory die may be larger than the favored DSP die. Or, adjacent stacked die in the package may both be memory die, with the upper die being the same size as, or larger than, the lower die. The yield of DSP is typically low, and where the lower die in a stacked die package is a DSP, it may be impossible in practice to test the DSP until after it is placed on the substrate; and where the DSP is wire bonded it may be impossible in practice to test the die on the substrate because the handling during testing causes damage to exposed wires. In a conventional stacked die package, therefore, the upper die must be stacked over the lower die before the lower die can be tested, and where the lower die proves at that point in the process to be unacceptable, the stacked package must be discarded, resulting in a waste both of the spacer and the upper die and of processing steps for stacking them.

SUMMARY

This invention is directed to multiple chip modules ("MCM"). In one aspect of the invention the MCM includes a bottom (lower) substrate, a first package inverted and mounted over an upper side of the bottom substrate and electrically interconnected with the bottom substrate by wire bonds, and at least a first die mounted over the first package substrate (at the upward-facing side). The first die mounted over the first package substrate can be electrically interconnected with either the bottom substrate or the upward-facing side of the first package, or with both the bottom substrate and the upward-facing side of the first package substrate. In some embodiments a second die is stacked beside the first die or over the upward-facing side of the first die, with or without a spacer as may be required according to the relative dimensions of the first and second die. The second die mounted over the first die can be electrically interconnected with any of (or any combination of) either the bottom substrate or the upward-facing side of the first package, or the upward-facing (active) side of the first die.

Generally according to this aspect of the invention, rather than having an upper die stacked over a lower die, as in a stacked die package, or an inverted upper package stacked over a lower die or a lower package, a die (or more than one die) is mounted over an inverted package mounted on the module substrate.

Any of a variety of standard packages can be used for the inverted lower package.

Any of a variety of die having any of a variety of functionalities can be used for the die mounted or stacked over the inverted lower package.

The invention is useful particularly in devices employing multiple die modules known variously as "multi chip package" ("MCP") or "system in package" ("SiP") or "multi package module" ("MPM"). Multiple chip package modules according to the invention can be used in construction of computers, telecommunications, and consumer and industrial electronics. The invention can be particularly useful in portable electronic devices.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Another approach to integrating on the "z-axis" is to stack packages to form a multi-package module. Stacked packages can provide numerous advantages as compared to stacked-die packages.

For instance, each package in a stacked package module can be electrically tested, and rejected unless it shows satisfactory performance, before the packages are stacked. As a result the final stacked multi-package module yields can be maximized. While "naked" die can be tested, testing can be more readily carried out in the package, particularly where the pad pitch on the die is very small.

Figure 1A:
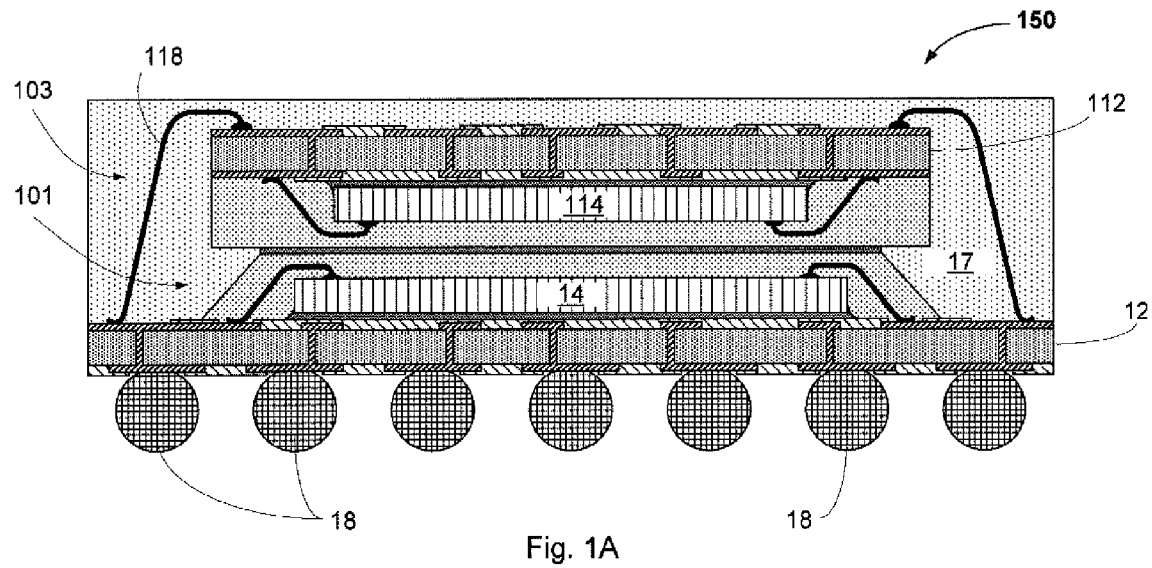
FIGS. 1A, 1B are diagrammatic sketches in a sectional view showing a multi-package module having an inverted upper package stacked over a lower package, in which the packages are interconnected by wire bonds.
Figure 1B:
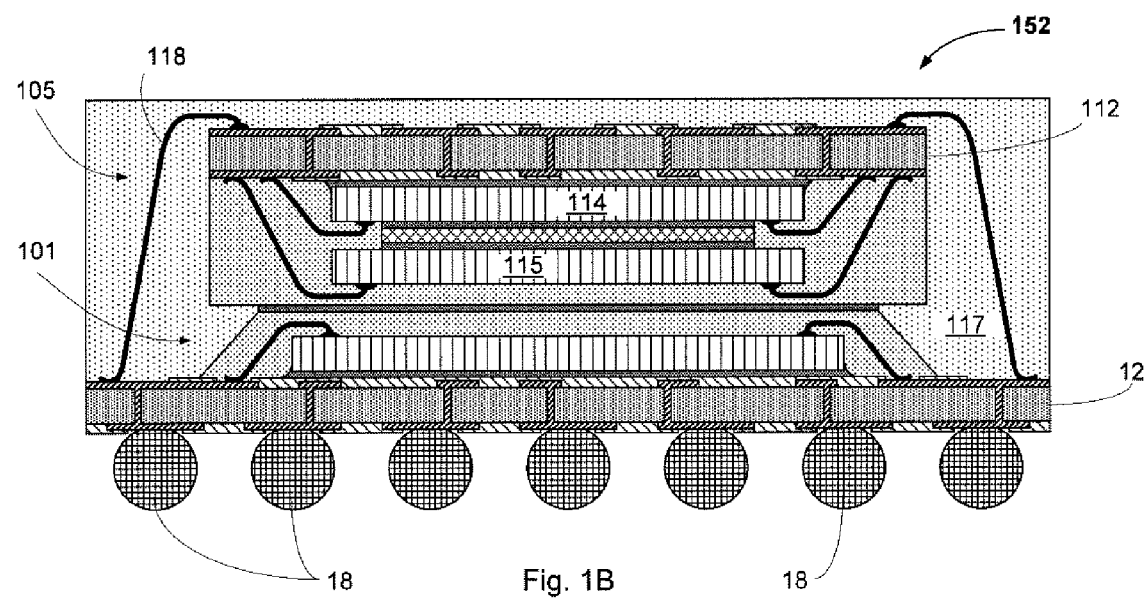

Examples of stacked multi-package modules 150, 152 are illustrated in FIGS. 1A and 1B. In these examples, z-interconnection between the stacked packages in the MPM is by wire bonds, and an upper package is inverted.

Referring particularly to FIG. 1A, a lower package 101 (here a ball grid array package) includes a die 14 mounted on an upper (upward-facing) side of a substrate 12. In this example the die 14 is electrically interconnected to the substrate 12 by wire bonds, and the die and wire bonds are molded. An upper package 103 (here a saw-singulated land grid array package) is inverted and mounted upon the lower package 101. The upper package 103 in this example includes a die 114 mounted on an upper (downward-facing, because the package is inverted) side of a substrate 112. In this example the die 114 is electrically interconnected to the substrate 112 by wire bonds, and the die and wire bonds are encapsulated and saw singulated. The upper and lower packages are interconnected by wire bonds 118, and the packages and the interconnection wires 118 are encapsulated in a module encapsulation 17. The module encapsulation 17 covers a land side of the upper package. Second-level interconnect solder balls 18 are mounted onto ball pads on the lower side of the substrate 12, for interconnection of the module with, for example, a motherboard. Thus, the substrate 12 serves both as a lower package substrate and as a module substrate.

Various configurations of various stacked packages, including a bottom (lower) package and at least one inverted top (upper) package, can be employed in such MPMs. Stacked multi-package modules having an inverted upper package are described in, for example, International Application Number PCT/US2003/031987, International Publication Number WO 2004/034433 A2, 22 Apr. 2004, hereby incorporated by reference. For example, as shown in FIG. 1B, the inverted upper package 105 can be a stacked die package, with or without a spacer between adjacent die, as may be required for the particular die in the stack. Referring to FIG. 1B, the lower package is a ball grid array package as in FIG. 1A. The inverted upper package 105 includes a first die 114 mounted on an upper (downward-facing because the package is inverted) side of a substrate 112. A spacer is mounted on an upper (downward-facing) active side of the first die 114, and a second die 115 is mounted on the spacer. In this example the die 114, 115 are electrically interconnected to the substrate 112 by wire bonds, and the die and wire bonds are encapsulated and saw singulated. The upper and lower packages are interconnected by wire bonds 118, and the packages and the interconnection wires 118 are encapsulated in a module encapsulation 117. Second-level interconnect solder balls 18 are mounted onto ball pads on the lower side of the substrate 12, for interconnection of the module with, for example, a motherboard. Thus, the substrate 12 serves both as a lower package substrate and as a module substrate.

Referring again to FIGS. 1A and 1B, in each package the die is (or the die are) referred to as being attached to an upper surface of the package substrate, it being appreciated that the package need not have any particular orientation in use. According to the invention, the top package is inverted, that is to say, it is attached upside downward and downside upward. Because the upper LGA is inverted in the module, so that it is relatively speaking upside-down or downside-up, the surface of the upper LGA to which the first die is attached, which would customarily be termed the upper surface or upper side of the LGA substrate, is referred to as the downward or downward facing surface of the inverted LGA; and the opposite surface, which would customarily be termed the lower surface or lower side, is referred to in the text herein as the upward or upward facing surface.

In the configuration in FIG. 1A, for example, the surface of the top package substrate onto which the die is attached faces toward the bottom package, and, accordingly the "upper" surface of the top package, to which the die is affixed, is here referred to as the "downward facing" surface of the top package substrate, it being appreciated again that the module need not have any particular orientation in use. That is to say, once the top package has been inverted in the module according to the invention, for purposes of description the surface of the top package substrate having an "upper" metal layer is said to be "downward facing", and the surface of the top package substrate having a "lower" metal layer is said to be "upward facing".

Figure 2A:
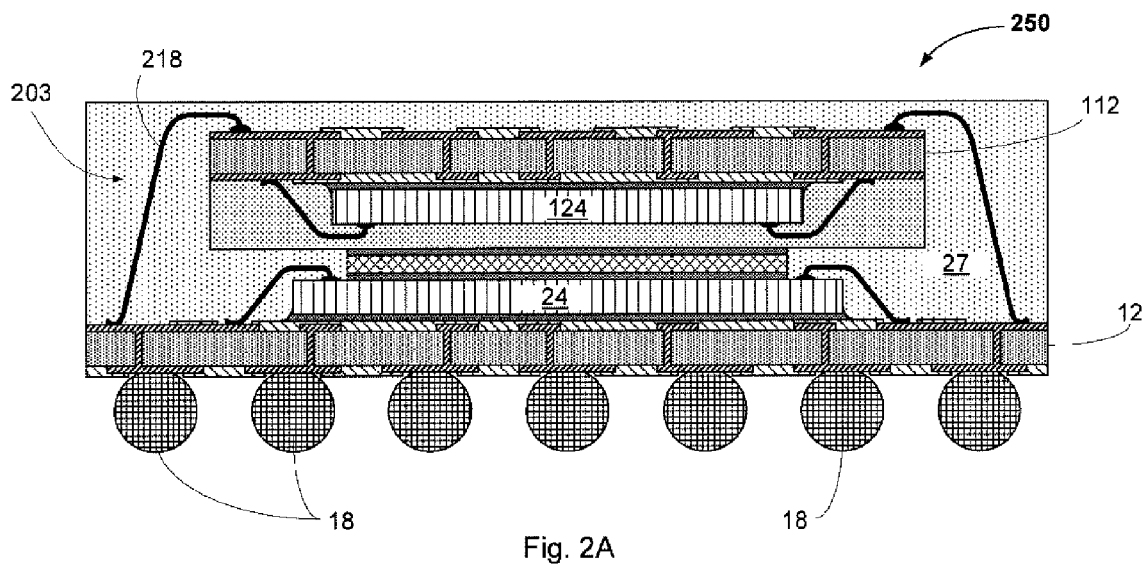
FIGS. 2A, 2B are diagrammatic sketches in a sectional view showing a multi-chip module having an inverted upper package stacked over a lower die mounted on a module substrate, in which the upper package is interconnected by wire bonds to the module substrate.

Another approach to integrating on the "z-axis" is to stack an inverted package over a die on a module substrate. Generally, rather than having an upper die stacked over a lower die, as in a stacked die package, an inverted upper package (such as a land grid array package) is stacked over the lower die, with provision where necessary (such as by a spacer) for a standoff between the upper package and the lower die. The standoff or spacer, where provided, physically separates the upper package from the lower die; as a consequence, the lower die can be wire bonded to the lower substrate, and z-interconnect can be made by wire bonding between the upper package substrate and the lower package substrate (or the lower die). Stacked multi-chip modules having an inverted upper package stacked over a chip on a lower substrate are described in U.S. patent application Ser. No. 11/014,257, filed Dec. 16, 2004; also International Application Number PCT/US2004/042413, International Publication Number WO 2005/059967 A2, 30 Jun. 2005, hereby incorporated by reference. Examples are shown at 250, 252 in FIGS. 2A, 2B. Referring to FIG. 2A, a first die 24 is mounted onto an upper side of a substrate 12, and the die 24 and the substrate 12 are electrically interconnected by wire bonds. A spacer (such as a "dummy" die) is mounted upon the upper side (the active side) of the first die, and an upper package 203 is inverted and mounted over the spacer. The spacer provides a standoff between the upper surface of the first die and the downward-facing surface of the molding on the inverted upper package 203, of a height sufficient to avoid interference of the upper package with the wire bonds connecting the first die 24 to the substrate 12. The inverted upper package 203 in this example is as the upper package 103 in FIG. 1A. Package 103 includes a die 124 mounted on an upper (downward-facing, because the package is inverted) side of a substrate 112. In this example the die 124 is electrically interconnected to the substrate 112 by wire bonds, and the die and wire bonds are encapsulated and saw singulated. The upper and lower packages are interconnected by wire bonds 218, and the package and the first die and the interconnection wires 218 are encapsulated in a module encapsulation 27. Second-level interconnect solder balls 18 are mounted onto ball pads on the lower side of the substrate 12, for interconnection of the module with, for example, a motherboard. Thus, the substrate 12 serves both for mounting and interconnection of the first die, and as a module substrate, providing connection of the first die and of the upper package to the motherboard.

Figure 2B:
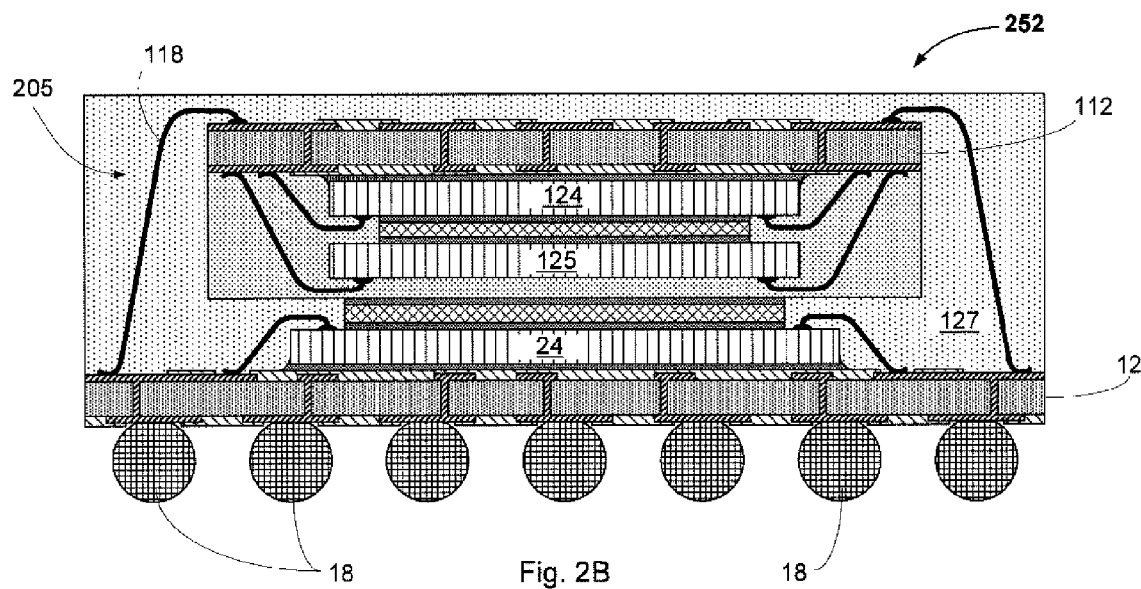

Various configurations of various stacked packages, including at least one inverted top (upper) package stacked over a lower die, can be employed in such MCMs. For example, as shown in FIG. 2B, the inverted upper package 205 can be a stacked die package, with or without a spacer between adjacent die, as may be required for the particular die in the stack. Referring to FIG. 2B, a first die 24 is mounted onto, and is electrically interconnected by wire bonds with, a lower substrate as in FIG. 2A. The inverted upper package 205 includes a first upper package die 125 mounted on an upper (downward-facing because the package is inverted) side of a substrate 112. A spacer is mounted on an upper (downward-facing) active side of the first upper package die 124, and a second upper package die 125 is mounted on the spacer. In this example the die 124 and 125 are electrically interconnected to the substrate 112 by wire bonds, and the die and wire bonds are encapsulated and saw singulated. The upper and lower packages are interconnected by wire bonds 218, and the packages and the interconnection wires 218 are encapsulated in a module encapsulation 127. Second-level interconnect solder balls 18 are mounted onto ball pads on the lower side of the substrate 12, for interconnection of the module with, for example, a motherboard. Thus, the substrate 12 serves both as a lower package substrate and as a module substrate.

Figure 3A:
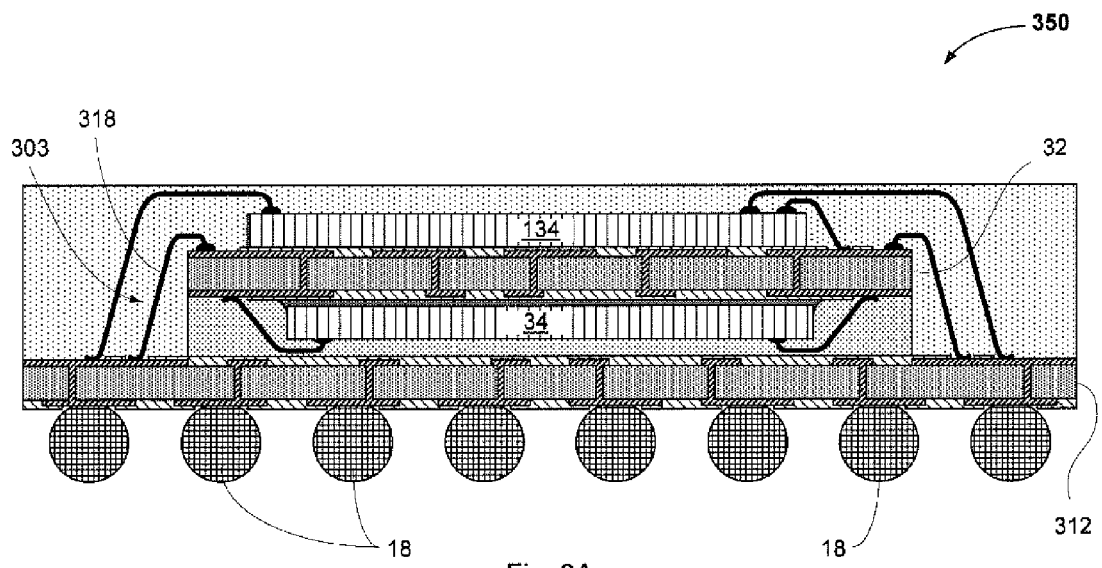
FIGS. 3A, 3B are diagrammatic sketches in a sectional view showing a multi-chip module according to an aspect of the invention.

Referring now to FIG. 3A, there is shown a multi-chip module 350 according to one aspect of the invention. A lower substrate 312 is provided. A first package 303 is inverted and mounted over the upper (upward-facing) side of the lower substrate 312. The first package 303 is electrically interconnected by wire bonds 318 between bond sites on the lower (upward-facing, because the package is inverted) side of the first package substrate 32 and bond sites in a metal layer at the upper side of the lower substrate. In the example shown, the first package 303 is a saw-singulated land grid array package and, when inverted, the land side of the substrate faces upward. Also, in the example shown, the die 34 in the first package is interconnected with the first package substrate 32 by wire bonding.

Still referring to FIG. 3A, a first die 134 is mounted upon the upward-facing side of the first package. The die 134 is electrically interconnected, in this example, by wire bonding both to the upward-facing (land) side of the first package substrate 32 and to the upward-facing side of the lower (module) substrate 312.

The first package can be any of a variety of package types, containing one or more of any of a variety of die having any of a variety of functionalities. The die may include, for example, a processor die such as, e.g., an ASIC, or a GPU, or a CPU. Or, the first package may be a memory package, having one memory die or two or more stacked memory die. Where one or more die in the first package is a radio-frequency (rf) die, it can be advantageous to electrically shield the die or the package. The shield can be arranged to substantially surround an rf die within the first package.

Any of a variety of substrate types can be employed in the lower (module) substrate and in the first package substrate, including for example: a laminate with 2-6 metal layers, or a build up substrate with 4-8 metal layers, or a flexible polyimide tape with 1-2 metal layers, or a ceramic multilayer substrate. The substrate 32 shown by way of example in FIGS. 3A, 3B has two metal layers, each patterned to provide appropriate circuitry and connected by way of vias. The die is conventionally attached to a surface of the substrate using an adhesive, typically referred to as the die attach epoxy, and the surface of the substrate onto which the die is attached may be referred to as the "upper" surface, and the metal layer on that surface may be referred to as the "upper" metal layer, although the die attach surface need not have any particular orientation in use.

Where the first package has one die, the die can be affixed to the first package substrate with the active side facing away from the substrate, and electrically connected to the substrate by wire bonds connecting pads on the die with bond sites in the patterned metal layer at the die attach side of the substrate, as illustrated in FIG. 3A; or, the die can be a flip-chip die, mounted with the active side facing the first package substrate and electrically connected by balls or bumps attached to pads on the die and connected to interconnect sites in the patterned metal layer at the die mount side of the substrate. The first package can be a stacked die package and, in such embodiments the first die can be a wire-bonded die; or the first die can be a flip-chip die.

More than one die can be mounted (or stacked) over the inverted first package. Two or more smaller die can be mounted side-by-side on the upward-facing (land) side of the first package substrate, for example. And one or more additional die can be stacked over the first die, with a spacer as may be required according to the relative dimensions of the first and additional die.

Figure 3B:
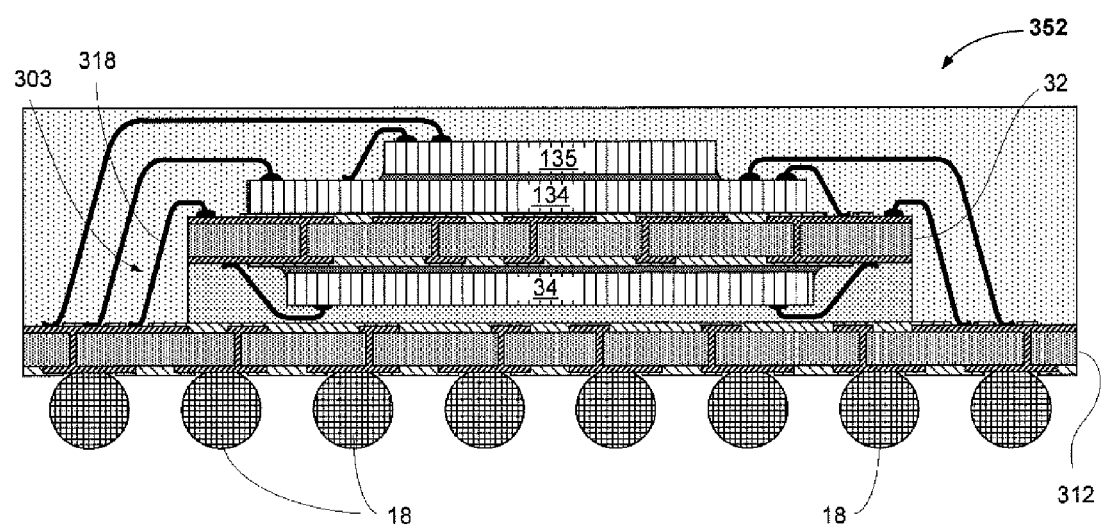

An example is shown generally at 352 in FIG. 3B. Here, an additional die 135 is stacked over the first die 134. In this example, the additional die is electrically interconnected by wire bonds to the first die 134 and to the lower (module) substrate 312. In other embodiments interconnection could additionally be made to the upward-facing (land) side of the first package substrate 32.

Where one additional die is mounted over the inverted first package, the die can be affixed to the first package substrate with the active side facing away from the substrate, and electrically connected to the substrate by wire bonds connecting pads on the die with bond sites in the patterned metal layer at the land side of the substrate, as illustrated in FIG. 3A; or, the die can be a flip-chip die, mounted with the active side facing the land side of the first package substrate and electrically connected by balls or bumps attached to pads on the die and connected to interconnect sites in the patterned metal layer at the land side of the substrate. Where more than one die are stacked over the inverted first package, the first die can be a wire-bonded die; or the first die can be a flip-chip die. A second die can then be affixed to the backside of the flip chip die, with the active side of the second die facing away from the first die, and wire-bonded to the land side of the first package substrate and/or to the module substrate.

A heat spreader can be employed. The heat spreader can, for example, have a planar surface that is situated to be exposed at the top of the module.

According to the invention, the first package can be fully tested before it is mounted onto the lower substrate. The module can be made very thin. A particular module according to the invention can be readily made from any of a variety of components, according to the end use, and the components can be selected from off-the-shelf supplies. Accordingly the invention can be particularly useful in mobile, telecommunications, and consumer products, in which a product line may include devices having one or a few form factors and a wide range of capabilities or functionalities within each form factor.

All patents and patent applications referred to above are hereby incorporated by reference herein.

Other embodiments are within the following claims.

What is claimed is:

1. A multiple chip package module comprising:
   a module having a substrate and a package encapsulant on the substrate;
   a first package comprising:
      a first package substrate having a die mount side and a land side,
      a first package die mounted on the die mount side of the first package substrate,
      a first encapsulant covering the first package die and the die mount side of the first package substrate, and
      the first package being inverted and supported by the first encapsulant on the package encapsulant over a first side of the module substrate;
   wire bonds connecting a land side of the first package substrate with the first side of the module substrate; and
   a module encapsulant covering the land side.

2. The multiple chip package module of claim 1, further comprising a second additional die mounted over the module substrate and supporting the first encapsulant over the module substrate.

3. The multiple chip package module of claim 1 further comprising: a second additional die mounted over the module substrate; and wire bonds electrically connecting the second additional die with the module substrate.

4. The multiple chip package module of claim 1 further comprising: a second additional die mounted over the module substrate; wire bonds electrically connecting the second additional die with the module substrate; a second encapsulant encapsulating the second additional die; and the module encapsulant around the first encapsulant and package encapsulant over the module substrate.

5. The multiple chip package module of claim 1 wherein the first package comprises a plurality of die stacked over the die mount side of the first package substrate.

6. The multiple chip package module of claim 1 wherein the first package further comprises a second package die stacked over the first package die.

7. The multiple chip package module of claim 1 further comprising: a second additional die mounted over the module substrate; wire bonds electrically connecting the second additional die with the module substrate; second encapsulant encapsulating the second additional die, the second encapsulant supporting the first encapsulant over the module substrate; and a third encapsulant encapsulating the first and second encapsulants.

8. The multiple chip package module of claim 1 further comprising: a second additional die mounted on the land side of the first package substrate and electrically connected with the first package substrate.

9. The multiple chip package module of claim 1 further comprising a second additional die mounted on the land side of the first package substrate; wire bonds electrically connecting the second additional die with the land side of the first package substrate; and a second encapsulant encapsulating the first encapsulant and the second additional die.

10. The multiple chip package module of claim 1 wherein a plurality of die are mounted on the land side of the first package substrate and are electrically connected with the land side of the package substrate by wire bonding.

11. The multiple chip package module of claim 1 wherein the first encapsulant is mounted on the module substrate.

12. A computer containing the multiple chip package module of claim 1.

13. A portable electronic apparatus containing the multiple chip package module of claim 1.

14. A mobile telecommunications device containing the multiple chip package module of claim 1.

* * * * *